(12) United States Patent
Morozumi et al.

(10) Patent No.: US 8,083,330 B2
(45) Date of Patent: Dec. 27, 2011

(54) LIQUID-EJECTING HEAD, LIQUID-EJECTING APPARATUS, AND PIEZOELECTRIC TRANSDUCER

(75) Inventors: Koichi Morozumi, Shiojiri (JP); Jiro Kato, Suwa (JP); Satoshi Denda, Suwa (JP); Ichiro Asaoka, Chino (JP)

(73) Assignee: Seiko Epson Corporation, Tokyo (JP)

( * ) Notice: Subject to any disclaimer, the term of this patent is extended or adjusted under 35 U.S.C. 154(b) by 197 days.

(21) Appl. No.: 12/509,888

(22) Filed: Jul. 27, 2009

(65) Prior Publication Data

US 2010/0020135 A1    Jan. 28, 2010

(30) Foreign Application Priority Data

Jul. 28, 2008  (JP) .................. 2008-194037

(51) Int. Cl.
*B41J 2/045* (2006.01)
*B05C 11/00* (2006.01)
*B05D 5/00* (2006.01)

(52) U.S. Cl. ............. 347/71; 118/46; 427/256; 427/286
(58) Field of Classification Search ........................ None
See application file for complete search history.

(56) References Cited

U.S. PATENT DOCUMENTS

2008/0062228 A1 * 3/2008 Saito .............................. 347/71

FOREIGN PATENT DOCUMENTS

JP        06340423 A   * 12/1994
JP        2003-127366     5/2003

* cited by examiner

*Primary Examiner* — Matthew Luu
*Assistant Examiner* — Lisa Solomon
(74) *Attorney, Agent, or Firm* — Workman Nydegger

(57) ABSTRACT

A liquid-ejecting head includes a pressure-generating chamber communicatively connected to a nozzle opening and also includes a piezoelectric transducer including a first electrode, a piezoelectric layer disposed on the first electrode, and a second electrode disposed on the piezoelectric layer. The first electrode contains platinum and titanium oxide with a rutile content of 76.5 to 100 mole percent.

13 Claims, 4 Drawing Sheets

LIQUID-EJECTING HEAD, LIQUID-EJECTING APPARATUS, AND PIEZOELECTRIC TRANSDUCER

BACKGROUND OF THE INVENTION

The entire disclosures of Japanese Patent Application No. 2008-194037, filed Jul. 28, 2008 is expressly incorporated herein by reference.

TECHNICAL FIELD

The present invention relates to a liquid-ejecting head which is capable of ejecting a liquid from a nozzle opening. More particularly, the present invention relates to a liquid-ejecting head, a liquid-ejecting apparatus, and a piezoelectric transducer including a first electrode, a piezoelectric layer, and a second electrode.

RELATED ART

Piezoelectric transducers for use in liquid-ejecting heads typically include two electrodes and a piezoelectric layer disposed between the two electrodes. The piezoelectric layer is generally made of a piezoelectric material having an electromechanical transducing function or a crystalline dielectric material. The piezoelectric transducers are used as actuators which operate in a flexural vibration mode and are mounted in liquid-ejecting heads. Typical examples of the liquid-ejecting heads which use such transducers are ink-jet recording heads which include diaphragms which form portions of pressure-generating chambers which are communicatively connected to nozzle openings. The diaphragms are distorted with piezoelectric transducers so that ink contained in the pressure-generating chambers is pressurized, causing droplets of ink to be ejected from the nozzle openings.

For example, Japanese Unexamined Patent Application Publication No. 2003-127366 describes an example of a piezoelectric transducer for use in an ink-jet recording heads. The piezoelectric transducers are formed so as to independently correspond to pressure-generating chambers in such a manner that a single piezoelectric material layer is formed over a surface of a diaphragm by a deposition process and then divided using a lithography process into sections having a shape corresponding to that of the individual pressure-generating chambers.

One problem with the piezoelectric transducers currently known in the art, however is that the piezoelectric transducers often peel off and/or crack during operation. This problem is worsened as the amount of power supplied to the device is reduced, creating increasing demands for liquid-ejecting heads that can eject heavy ink droplets with low driving voltage. The problem is common not only in ink-jet recording heads and piezoelectric transducers for use in liquid-ejecting heads but also in liquid-ejecting heads which eject liquids other than ink and piezoelectric transducers for use in other devices.

BRIEF SUMMARY OF THE INVENTION

An advantage of some aspects of the invention is to provide a liquid-ejecting head which has increased resistance to damage such as cracking and stripping, which also has enhanced piezoelectric properties. The invention also describes a liquid-ejecting apparatus and piezoelectric transducer with similar resistance to damage and enhanced piezoelectric properties.

A first aspect of the present invention is a liquid-ejecting head which includes a pressure-generating chamber communicatively connected to a nozzle opening and also includes a piezoelectric transducer. The piezoelectric transducer includes a first electrode, a piezoelectric layer disposed on the first electrode, and a second electrode disposed on the piezoelectric layer. The first electrode contains platinum and titanium oxide with a rutile content of 76.5 to 100 mole percent.

One advantage of this liquid-ejecting head is that the internal stress caused by the thermal expansion of the titanium oxide in the first electrode can be reduced and cracking and/or peeling can be prevented because a lattice constant of the titanium oxide therein is adjusted to that of platinum or that of a component of the piezoelectric layer. Since the relative dielectric constant of the titanium oxide therein can be adjusted to a relatively large value, a large voltage can be applied to the piezoelectric layer. Therefore, a large piezoelectric distortion can be achieved with a low driving voltage.

Another aspect of the present invention provides a piezoelectric transducer including a first electrode, a piezoelectric layer disposed on the first electrode, and a second electrode disposed on the piezoelectric layer. The first electrode contains platinum and titanium oxide and the titanium oxide with a rutile content of 76.5 to 100 mole percent. The transducer of the invention provides similar advantages to those described with reference to the liquid-ejecting head.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments of the present invention will now be described in detail.

First Embodiment

Figure 1:
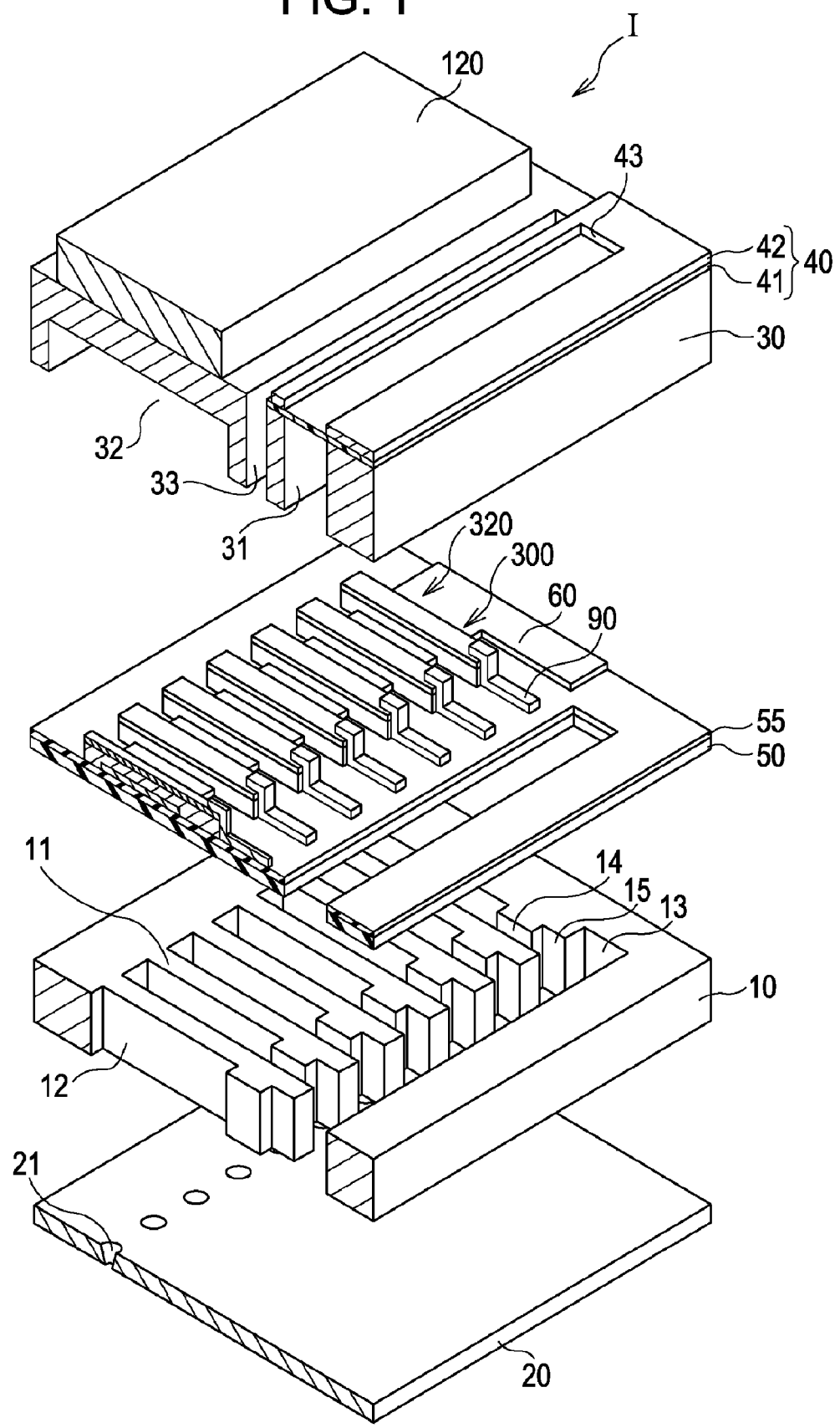
FIG. 1 is an exploded perspective view of an ink-jet recording according to a first embodiment of the present invention.
Figure 2A:
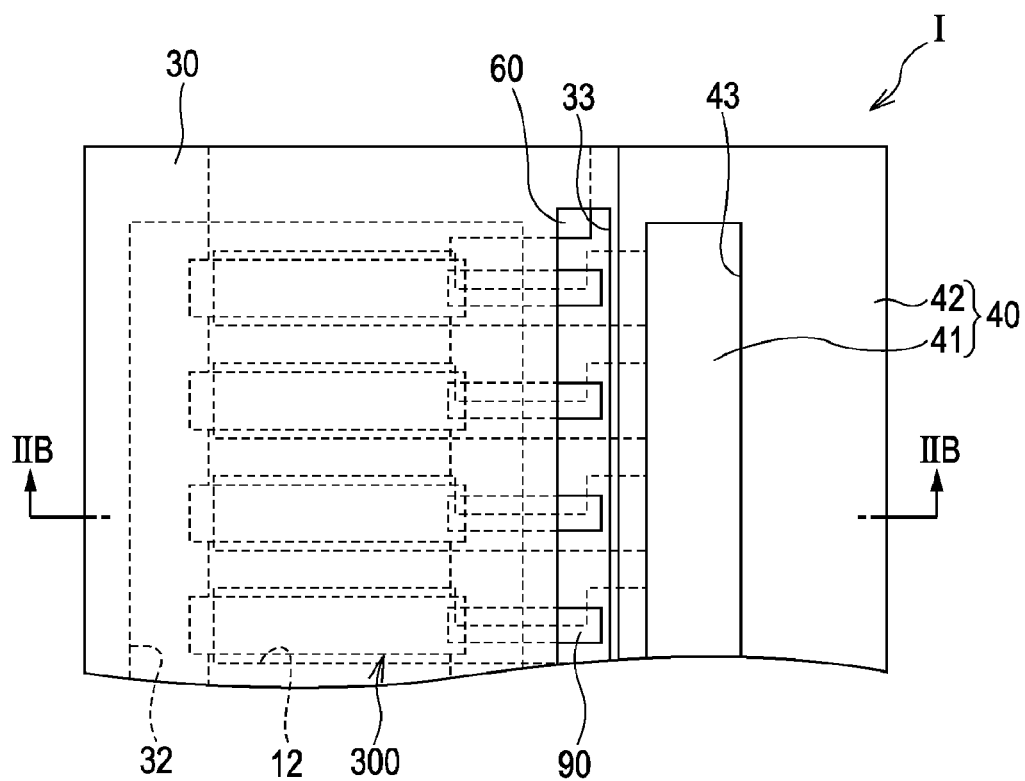
FIG. 2A is a plan view of the ink-jet recording head shown in FIG. 1.
Figure 2B:
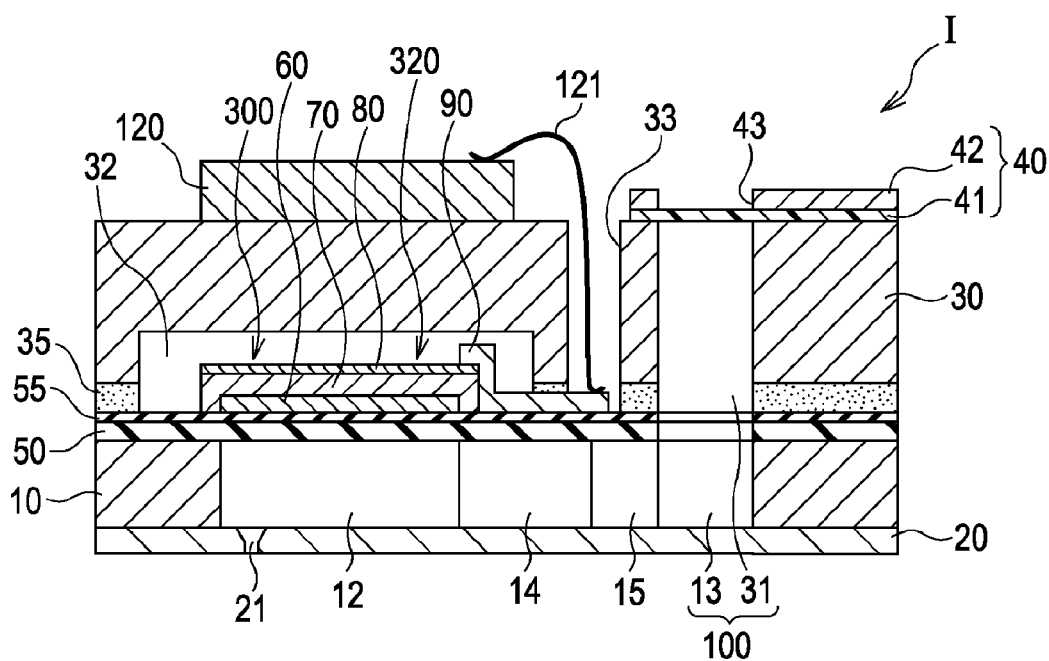
FIG. 2B is a sectional view taken along the line IIB-IIB of FIG. 1.

FIG. 1 shows an ink-jet recording head in exploded perspective view. The ink-jet recording head is an example of a liquid-ejecting head according to a first embodiment of the present invention. FIG. 2A is a plan view of the ink-jet recording head. FIG. 2B is a sectional view taken along the line IIB-IIB of FIG. 1.

With reference to FIG. 1, the ink-jet recording head includes a channeled substrate 10 made of single-crystalline silicon with a (110) orientation. The channeled substrate 10 carries an elastic diaphragm 50 having a thickness of about 0.5 to 2.0 μm, which is formed by thermally oxidizing a first surface of the channeled substrate 10.

The channeled substrate 10 includes separators 11, pressure-generating chambers 12, ink supply channels 14, and connection channels 15 formed by anisotropically etching a second surface of the channeled substrate 10 that is opposite to the first surface. The pressure-generating chambers 12 are separated by the separators 11 and are arranged in the width (or lateral) direction of the pressure-generating chambers 12. The pressure-generating chambers 12 each have a first end portion and a second end portion opposite to the second end portion. The ink supply channels 14 and the connection channels 15 are located on the first end portion side of the pressure-generating chambers 12 and are separated by the separators 11. The connection channels 15 have end portions communicatively connected to a communicating portion 13 that forms a portion of a reservoir 100 which is common to the pressure-generating chambers 12 and which serves as an ink or liquid chamber. That is, the channeled substrate 10 has a liquid passage which includes the pressure-generating chambers 12, the communicating portion 13, the ink supply channels 14, and the connection channels 15.

The ink supply channels 14 are communicatively connected to the first end portions of the pressure-generating chambers 12 and have a cross-sectional area which is less than that of the pressure-generating chambers 12. The ink supply channels 14 are narrow regions formed between the reservoir 100 and the pressure-generating chambers 12 and have a width less than that of the pressure-generating chambers 12. In this embodiment, the ink supply channels 14 narrowed by the extending one side of the separators 11 formed between the pressure generating chambers 12. Alternatively, the ink supply channels 14 may be narrowed by extending two or more sides of the separators 11 between pressure generating chambers 12. The connection channels 15 are communicatively connected to the ink supply channels 14 and are located on the side opposite to the pressure-generating chambers 12 with the ink supply channels 14 disposed therebetween. The connection channels 15 have a cross-sectional area which is greater than that of the ink supply channels 14 in side view. In this embodiment, the connection channels 15 have the same cross-sectional area as that of the pressure-generating chambers 12.

That is, the pressure-generating chambers 12, the ink supply channels 14, and the connection channels 15 are arranged in the channeled substrate 10 and are separated by the separators 11.

The channeled substrate 10 has a nozzle plate 20 fixed to the second surface thereof with an adhesive or a thermoweldable film. The nozzle plate 20 has nozzle openings 21 which are communicatively connected to the second end portions of the pressure-generating chambers 12. The nozzle plate 20 has a thickness of, for example, 0.01 to 1 mm and a coefficient of linear expansion of, for example, $2.5 \times 10^{-6}$ to $4.5 \times 10^{-6}$ per degree Celsius at 300° C. or lower and is made of glass-ceramic, single-crystalline silicon, stainless steel, or the like.

The elastic diaphragm 50 is disposed on the first surface of the channeled substrate 10 and has a thickness of about 0.5 to 2.0 μm as described above. The elastic diaphragm 50 is overlaid with an insulating layer 55 with a thickness of, for example, about 0.4 μm. The electrodes and subsequent layers formed by a process described more fully below on the insulating layer 55 in the following order: a first electrode 60 with a thickness of, for example, about 0.2 μm; piezoelectric layers 70 with a thickness of, for example, about 1.1 μm; and second electrodes 80 with a thickness of, for example, about 0.05 μm. The first electrode 60, the piezoelectric layers 70, and the second electrodes 80 together form piezoelectric transducers 300. The piezoelectric transducers 300 are defined as regions containing portions of the first electrode 60, the piezoelectric layers 70, and the second electrodes 80. Typically, the second electrodes 80 and the piezoelectric layers 70 are formed by patterning so as to correspond to the pressure-generating chambers 12. The following regions are herein referred to as piezoelectric active regions 320: regions which contain the second electrodes 80 and the piezoelectric layers 70 which are piezoelectrically distorted when voltages are applied between the first electrode 60 and the second electrodes 80. In this embodiment, the first electrode 60 is used as a common electrode for the piezoelectric transducers 300 and the second electrodes 80 are used as individual electrodes for the piezoelectric transducers 300. This configuration may be reversed, however, such that the first electrode 60 is an individual electrode and the second electrodes 80 is a common electrode, depending on the specific configuration being used. Combinations of the piezoelectric transducers 300 and vibrating diaphragms distorted by driving the piezoelectric transducers 300 are referred to as actuators. In this embodiment, the elastic diaphragm 50, the insulating layer 55, and the first electrode 60 act as vibrating diaphragms. Alternatively, only a first electrode 60 may Be used as a vibrating diaphragm without forming the elastic diaphragm 50 and the insulating layer 55. Alternatively, the piezoelectric transducers 300 may substantially act as vibrating diaphragms.

The first electrode 60 contains titanium oxide (TiOx) and platinum (Pt). In this embodiment, the first electrode 60 further contains iridium oxide (IrOx). The titanium oxide in the first electrode 60 is a material that enhances the adhesion between the first electrode 60 and the insulating layer 55. The platinum in the first electrode 60 is a material that does not lose conductivity when the first electrode 60 is subjected to high temperature during the heat treatment used to form the piezoelectric layers 70. The iridium oxide in the first electrode 60 is a material that prevents a component of the piezoelectric layers 70 from diffusing into the first electrode 60 and its lower layers when the piezoelectric layers 70 are formed.

The first electrode 60 is formed by alloying or mixing materials such as titanium oxide, platinum, and iridium oxide. The term "alloying" as used herein means an method for metallically binding a metal element to another metal element. The term "mixing" as used herein means a method wherein no metal element is metallically bound to any other metal element.

The titanium oxide in the first electrode 60 has a rutile content of 76.5 mole percent or more. The fact that titanium oxide has a rutile content of 76.5 mole percent or more means that the content of rutile in titanium oxide is 76.5 mole percent or more. Therefore, the titanium oxide in the first electrode 60 has an anatase and/or brookite content of 23.5 mole percent or less. The titanium oxide in the first electrode 60 may contain an amorphous portion.

Table 1 below summarizes the thermal expansion coefficients, relative dielectric constants, and lattice constants of rutile, anatase, and brookite. Table 1 also shows those of platinum and lead zirconate titanate (PZT).

TABLE 1

| Materials | | Titanium oxide (TiO$_x$) | | | Platinum (Pt) | Lead zirconate titanate (PZT) |
|---|---|---|---|---|---|---|
| Crystal forms | | Rutile | Anatase | Brookite | | Perovskite |
| Crystal systems | | Tetragonal | Tetragonal | Orthorhombic | Tetragonal | |
| Thermal expansion coefficients ($10^{-6}$/° C.) | a-axis | 7.2 | 2.9 | | 9.1 | 1.0 |
| | c-axis | 9.9 | 6.6 | | | |

TABLE 1-continued

| Materials | | Titanium oxide (TiO$_x$) | | | Platinum (Pt) | Lead zirconate titanate (PZT) |
|---|---|---|---|---|---|---|
| Relative dielectric constants | | 115 | 50 | 80 | — | 2000 |
| Lattice constants (Å) | a-axis | 4.539 | 3.785 | 5.45 | 3.9231 | 4.05 |
| | b-axis | — | — | 9.18 | | |
| | c-axis | 2.959 | 9.514 | 5.14 | | |

As shown in Table 1, anatase-type titanium oxide has a large a-axis lattice constant of 9.514 Å and therefore has low compatibility with platinum, which has an a-axis lattice constant of 3.9231 Å, and lead zirconate titanate, which has an a-axis lattice constant of 4.05 Å.

In contrast, rutile-type titanium oxide has a c-axis lattice constant of 2.959 Å, which is close to the lattice constant of platinum and that of lead zirconate titanate, and therefore has high compatibility with platinum and lead zirconate titanate.

The c-axis thermal expansion coefficient of anatase-type titanium oxide is two or more times the a-axis thermal expansion coefficient. This causes an uneven stress to be applied to the surroundings of anatase-type titanium oxide to cause cracking and/or peeling.

In contrast, there is no significant difference between the a- and c-thermal expansion coefficients of rutile-type titanium oxide, meaning that the stresses applied to surroundings of rutile-type titanium oxide are approximately the same. Therefore, cracking and/or peeling can be prevented.

The relative dielectric constant of anatase-type titanium oxide is less than half that of rutile-type titanium oxide. When a voltage is applied to the first electrode 60 to drive the piezoelectric layers 70, a voltage is also applied to the titanium oxide present between the piezoelectric layers 70 and the first electrode 60. Therefore, when the titanium oxide between the piezoelectric layers 70 and the first electrode 60 has a low relative dielectric constant, the voltage applied to the first electrode 60 is mostly concentrated on the titanium oxide and not to the piezoelectric layers 70. In contrast, when the titanium oxide has a high relative dielectric constant, the voltage applied to the titanium oxide is small and the voltages applied to the piezoelectric layers 70 are large, meaning that a large piezoelectric distortion can be achieved with a low driving voltage. Therefore, the titanium oxide in the first electrode 60 preferably contains rutile in view of relative dielectric constant.

The titanium oxide in the first electrode 60 has a rutile content of 76.5 mole percent or more as described above. Since the breaking stress of titanium oxide is 0.07 to 0.1 GPa as described in *CRC Materials* science and *Engineering Handbook*, the relationship between the anatase content (in mole percent) of titanium oxide and the stress caused by thermal expansion is as shown in FIG. 3.

Figure 3:
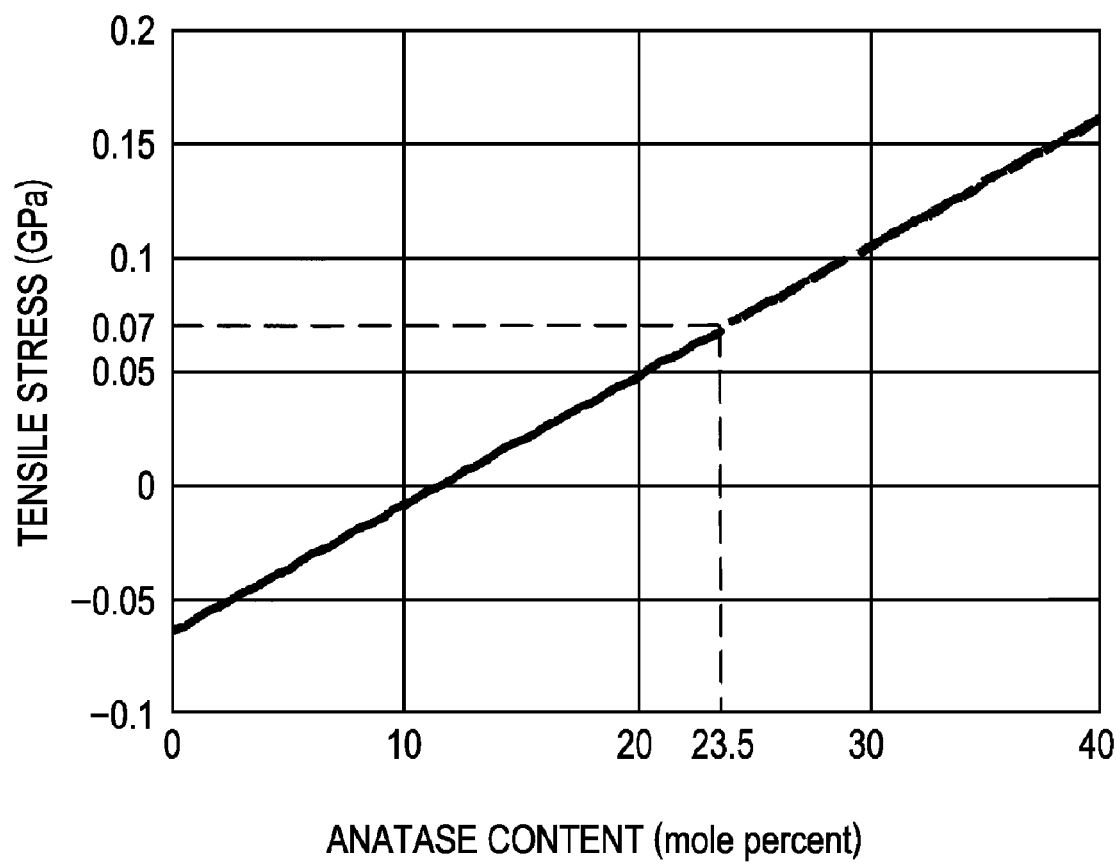
FIG. 3 is a graph showing the relationship between the anatase content of titanium oxide and the stress caused by thermal expansion.

As shown in FIG. 3, the tensile stress of titanium oxide is greater than 0.07 GPa when the anatase content of titanium oxide is greater than 23.5 mole percent. Therefore, in order to prevent the breakage of titanium oxide, the anatase content of titanium oxide is 23.5 mole percent or less so that the tensile stress of titanium oxide is 0.07 GPa or less. That is, when the rutile content of titanium oxide is 76.5 mole percent or more, the stress caused by thermal expansion is low and it is possible to prevent breakage such as cracking or peeling. The whole of titanium oxide is more preferably rutile, that is, the rutile content of titanium oxide is more preferably 100 mole percent. The fact that the rutile content of titanium oxide is 100 mole percent means that the rutile content of titanium oxide determined to be 100 mole percent using a high-resolution transmission electron microscope (HRTEM). When a high-resolution transmission electron microscope is used to analyze the crystallinity of titanium oxide, it is impossible to analyze titanium oxide with a crystallinity of 10% or less. Therefore, the fact that the whole of titanium oxide is rutile herein substantially means that the rutile content of titanium oxide is 90 to 100 mole percent.

The first electrode 60 can be in such a manner that an adhesive layer made of titanium (Ti), a platinum layer made of platinum (Pt), and an iridium layer made of iridium (Ir) are deposited on the insulating layer 55 in that order before forming the piezoelectric layers 70 and heat-treating the layers. The titanium in the adhesive layer remains at the interface between the first electrode 60 and the insulating layer 55 and is oxidized into titanium oxide. Alternatively, the titanium in the adhesive layer migrates toward the piezoelectric layers 70, that is, toward the diffusion-preventing layer made of iridium oxide formed by oxidizing iridium, where it is thermally oxidized into titanium oxide.

When the adhesive layer has an extremely large thickness, it is possible that an unoxidized region remains in the adhesive layer when the piezoelectric layers 70 are formed by heat treatment. Therefore, the adhesive layer preferably has a thickness of 50 nm or less when the piezoelectric layers 70 are formed by heat treatment.

Generally, brookite-type titanium oxide transforms into rutile-type titanium oxide at 650° C. or higher and anatase-type titanium oxide transforms into rutile-type titanium oxide at 900° C. or higher. Therefore, when the piezoelectric layers 70 are formed using a heat treatment process at 600° C. to 800° C., the titanium oxide therein exists in three crystalline forms: rutile, anatase, and brookite. In order to produce titanium oxide having a rutile content of 76.5 mole percent or more by heating the adhesive layer during the formation of piezoelectric layers 70, the adhesive layer, which is made of titanium, is thinly applied using a high-rate sputtering process. This allows the adhesive layer to be readily oxidized at relatively low temperature and allows rutile to be produced.

The titanium oxide in the first electrode 60 is not limited to that produced when titanium is heated during the formation of piezoelectric layers 70. While the first electrode 60 is formed, titanium oxide may be directly deposited on the insulating layer 55 using, for example, an RF sputtering process.

The adhesive layer may be heat-treated separately from the formation of the piezoelectric layers 70. That is, in the formation of the first electrode 60, the adhesive layer, the platinum layer, and the iridium layer may be formed and then heated in advance of the formation of the piezoelectric layers 70.

The piezoelectric layers 70 are disposed on the first electrode 60, are made of a piezoelectric material such as a polarized oxide, have a perovskite structure, and are crystalline. The piezoelectric layers 70 are preferably made of, for example, a ferroelectric material such as lead zirconate titanate or a ferroelectric material doped with a metal oxide such as niobium oxide, nickel oxide, or magnesium oxide. Examples of a material for forming the piezoelectric layers 70 include lead titanate (PbTiO$_3$), lead zirconate titanate (Pb(Zr,Ti)O$_3$), lead zirconate (PbZrO$_3$) lead lanthanum titanate ((Pb,La)TiO$_3$), lead lanthanum zirconate titanate ((Pb,La) (Zr,Ti)O$_3$), and lead zirconotitanate magnesoniobate (Pb(Zr,Ti)(Mg,Nb)O$_3$). The piezoelectric layers 70 are formed so as to have a thickness sufficient to prevent cracking and sufficient to exhibit distortion. In this embodiment, the piezoelectric layers 70 have a thickness of, for example, about 1 to 2 μm.

The second electrodes 80, which are used as individual electrodes for the piezoelectric transducers 300, are connected to lead electrodes 90 made of, for example, gold (Au) or the like. The lead electrodes 90 extend on the insulating layer 55 from end portions located close to the ink supply channels 14.

A protective substrate 30 is fixed on the channeled substrate 10 using an adhesive 35. The protective substrate 30 covers the piezoelectric transducers 300. The protective substrate 30 extends over the first electrode 60, the elastic diaphragm 50, and the lead electrodes 90 and has a reserving portion 31 that forms a portion of the reservoir 100. The reserving portion 31 extends through the protective substrate 30 in the thickness direction thereof and also extends in the width direction of the pressure-generating chambers 12. The reserving portion 31 is communicatively connected to the communicating portion 13. The reserving portion 31 and the communicating portion 13 form the reservoir 100. The reservoir 100 serves as an ink chamber common to the pressure-generating chambers 12.

The protective substrate 30 has a region facing the piezoelectric transducers 300 and includes a piezoelectric transducer-carrying portion 32 located in the region. The piezoelectric transducer-carrying portion 32 has such a space that does not interfere with the motion of the piezoelectric transducers 300. The space may be sealed or unsealed.

The protective substrate 30 is preferably made of a material, such as a glass or ceramic material, having the same thermal expansion coefficient as that of the channeled substrate 10. In this embodiment, the protective substrate 30 is made of the same single-crystalline silicon as that used to form the channeled substrate 10.

The protective substrate 30 has a perforation 33 extending therethrough in the thickness direction thereof. The lead electrodes 90 extend from the piezoelectric transducers 300 and have end portions exposed in the perforation 33.

The protective substrate 30 has a driving circuit 120 fixed thereon for driving the piezoelectric transducers 300. Examples of the driving circuit 120 include circuit boards and semiconductor integrated circuits (ICs). The driving circuit 120 is electrically connected to the lead electrodes 90 with connection leads including conductive wires such as bonding wires.

The protective substrate 30 has a compliance substrate 40 fixed thereon which includes a sealing film 41 and a fixed plate 42. The sealing film 41 is made of a flexible material, such as polyphenylene sulfide (PPS) having low stiffness and has a thickness of, for example, 6 μm. The reserving portion 31 has a face sealed with the sealing film 41. The fixed plate 42 is made of a hard material or a metal material such as stainless steel (SUS) and has a thickness of, for example, 30 μm. The fixed plate 42 has an opening 43 formed by removing a region of the fixed plate 42 facing the reservoir 100. The reservoir 100 has a face sealed with the sealing film 41.

The ink-jet recording head operates as described below. After the inkjet-recording head is supplied with ink from an ink supply port connected to an external ink supply unit, which is not shown, the inner region extending from the reservoir 100 to the nozzle openings 21 is filled with ink. Then, voltages corresponding to the pressure-generating chambers 12 are applied between the first electrode 60 and the second electrodes 80 in accordance with recording signals transmitted from the driving circuit 120, causing the elastic diaphragm 50, the insulating layer 55, the first electrode 60, and the piezoelectric layers 70 to become distorted. This increases the pressure in the pressure-generating chambers 12, causing droplets of the ink to be ejected from the nozzle openings 21.

Other Embodiments

The invention has been described with reference to the first embodiment described above. The present invention, however, is not limited to the first embodiment. In the first embodiment, the first electrode 60 is one formed by alloying or mixing titanium oxide, platinum, and iridium oxide. In an alternative embodiment, the first electrode 60 may have a configuration in which layers made of these materials are stacked. That is, the first electrode 60 may include, for example, an adhesive layer made of titanium oxide, a platinum layer made of platinum, a diffusion-preventing layer made of iridium oxide, and a crystal seed layer made of titanium oxide, where these layers being arranged on the insulating layer 55 in that order. The relative dielectric constant of titanium oxide is significantly affected by the crystal seed layer, which is located on the piezoelectric layer 70 side.

In the first embodiment, the channeled substrate 10 is made of single-crystalline silicon with a (110) orientation as described above. Alternatively, the channeled substrate 10 may be made of single-crystalline silicon with a (100) orientation, SOI, or glass.

In the first embodiment, the piezoelectric transducers 300 include the first electrode 60, piezoelectric layers 70, and second electrodes 80, which are arranged above the channeled substrate 10 in that order. In an alternative configuration, vertically vibrating piezoelectric transducers may be used where alternately stacked layers of a piezoelectric material and an electrode material vibrate in an axis direction.

Figure 4:
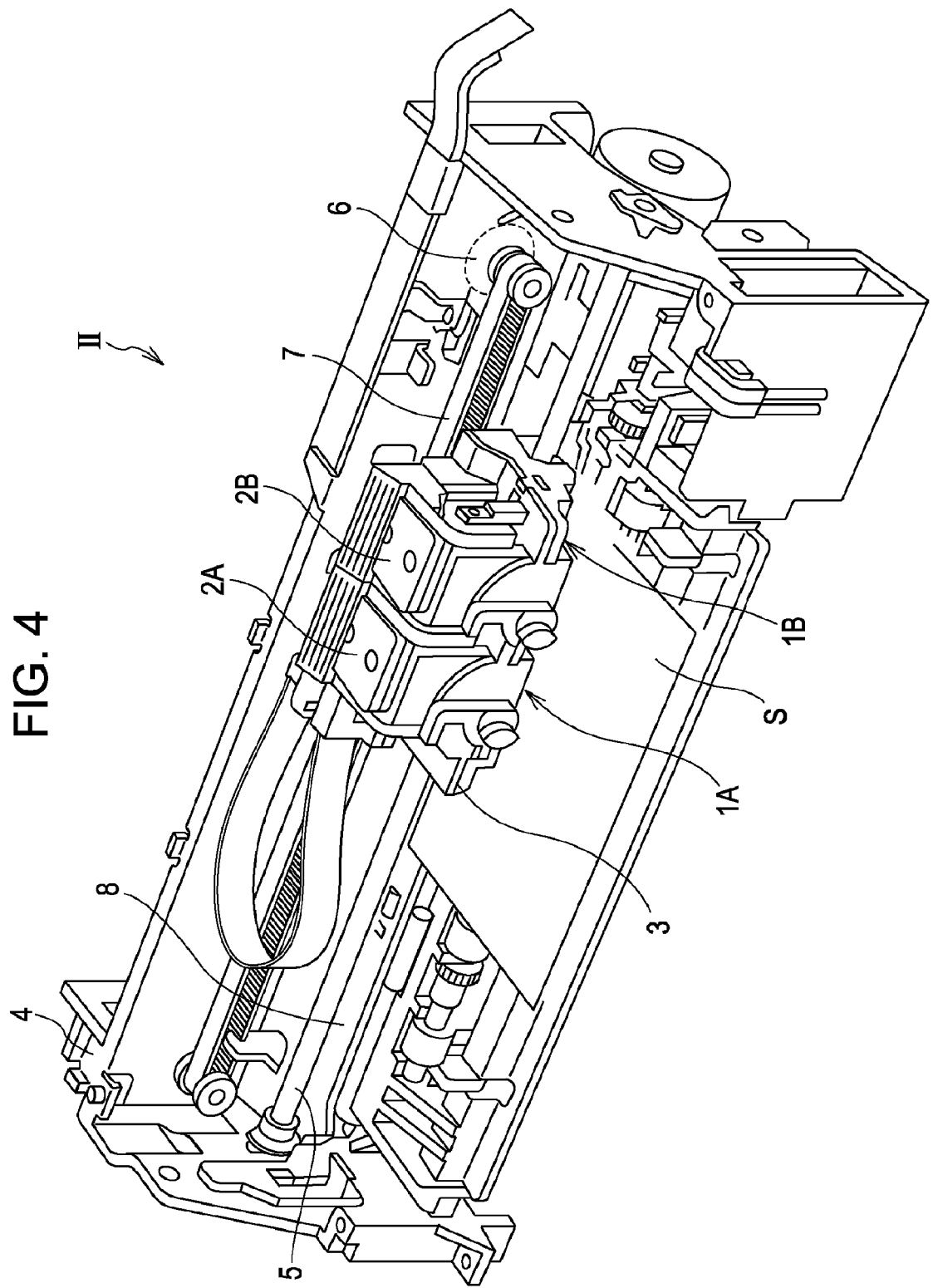
FIG. 4 is a schematic view of an ink-jet recording apparatus according to an embodiment of the present invention.

FIG. 4 is a schematic view of an ink-eject recording apparatus which uses the ink-jet recording head described above. The ink-jet recording head forms a portion of a recording head unit having an ink channel communicatively connected to an ink cartridge and/or the like.

With reference to FIG. 4, the ink-jet recording apparatus II includes a first recording head unit 1A, a second recording head unit 1B, a first cartridge 2A, a second cartridge 2B, a carriage 3 carrying the first and second recording head units 1A and 1B, a body 4, and a carriage shaft 5 attached to the body 4. The first and second recording head units 1A and 1B each include an ink-jet recording head such as the ink-jet recording head described above. The first and second cartridge 2A and 2B each form an ink supply unit and are detachably attached to the first and second recording head units 1A and 1B, respectively. The carriage 3 is attached to the carriage shaft 5 so as to be movable along the carriage shaft 5. The first and second recording head units 1A and 1B eject a black ink composition and a color ink composition, respectively.

The carriage 3, which carries the first and second recording head units 1A and 1B, is moved along the carriage shaft 5 according to a driving force generated by a driving motor 6 transmitted to the insulating layers 3 through a plurality of gears, which are not shown, and a timing belt 7. The body 4 includes a platen 8 extending along the carriage shaft 5. A recording sheet S which is a recording medium made of paper or the like is transported in such a manner that the recording sheet S is fed by feed rollers, which are not shown, and then wrapped on the platen 8.

In the first embodiment, the ink-jet recording head has been described as an example of a liquid-ejecting head capable of performing aspects of the invention. The present invention is equally applicable to various liquid-ejecting heads and is applicable to liquid-ejecting heads which eject liquids other than ink. Other examples of the liquid-ejecting heads which may perform aspects of the invention include various recording heads for use in image-recording apparatuses such as printers, colorant-ejecting heads used to manufacture color filters for liquid crystal displays, electrode material-ejecting heads used to form electrodes for field emission displays (FEDs), and bio-organic substance-ejecting heads used to produce biochips. Further, the present invention is not limited to a piezoelectric transducer mounted in a liquid-ejecting head such as an ink-jet recording head and is applicable to piezoelectric transducers mounted in other devices or apparatuses.

What is claimed is:

1. A piezoelectric element comprising:
   a piezoelectric member; and
   a layer that comprises titanium oxide;
   wherein a ratio of rutile type crystals to a total of rutile type crystals, anatase type crystals and brookite type crystals in the titanium oxide is 76.5 mole percent or more.

2. The piezoelectric element according to claim 1, wherein the layer is an electrode.

3. The piezoelectric element according to claim 2, wherein the electrode further comprises platinum.

4. The piezoelectric element according to claim 3, wherein the electrode is formed by alloying or mixing the titanium oxide and the platinum.

5. The piezoelectric element according to claim 2, wherein the electrode further comprises iridium oxide.

6. The piezoelectric element according to claim 1, wherein the piezoelectric member comprises lead, zirconium, and titanium.

7. The piezoelectric element according to claim 1, wherein the ratio of rutile type crystals to the total of the rutile type crystals, anatase type crystals and brookite type crystals in the titanium oxide is 90 mole percent or more.

8. The piezoelectric element according to claim 1, wherein the piezoelectric member is provided above the layer.

9. The piezoelectric element according to claim 2, wherein the electrode comprises a multi-layer arrangement comprising a titanium layer, a platinum layer formed on the titanium layer, and an iridium layer formed on the platinum layer, and wherein the 76.5 mole percent or more ratio of the rutile type crystals to the total of the rutile type crystals, anatase type crystals and brookite type crystals in the titanium oxide is provided by the multi-layer arrangement.

10. A liquid-ejecting head comprising the piezoelectric element according to claim 2.

11. A liquid-ejecting head comprising the piezoelectric element according to claim 9.

12. A liquid-ejecting apparatus comprising the liquid-ejecting head according to claim 10.

13. A liquid-ejecting apparatus comprising the liquid-ejecting head according to claim 11.

* * * * *